United States Patent
Anghel

(10) Patent No.: US 8,964,423 B2
(45) Date of Patent: Feb. 24, 2015

(54) LOW WEIGHT 3-PHASE 5-OUTPUT WIRE POWER CONVERSION SYSTEM FOR MICRO-GRID

(75) Inventor: Cristian Anghel, Oro Valley, AZ (US)

(73) Assignee: Honeywell International Inc., Morristown, NJ (US)

( * ) Notice: Subject to any disclaimer, the term of this patent is extended or adjusted under 35 U.S.C. 154(b) by 704 days.

(21) Appl. No.: 13/212,141

(22) Filed: Aug. 17, 2011

(65) Prior Publication Data

US 2013/0044522 A1    Feb. 21, 2013

(51) Int. Cl.
*H02J 3/36* (2006.01)
*H02M 5/45* (2006.01)
*H02J 3/26* (2006.01)
*G01R 31/02* (2006.01)

(52) U.S. Cl.
CPC .. *H02J 3/36* (2013.01); *Y02E 60/60* (2013.01); *H02J 3/26* (2013.01); *G01R 31/02* (2013.01)
USPC .............................................. 363/35; 363/37

(58) Field of Classification Search
CPC .................................. H02M 5/40; H02M 5/45
USPC ........................................ 323/361; 363/34–37
See application file for complete search history.

(56) References Cited

U.S. PATENT DOCUMENTS

| | | | | |
|---|---|---|---|---|
| 5,576,942 A | * | 11/1996 | Beverly et al. | 363/39 |
| 5,790,356 A | * | 8/1998 | Bottrell et al. | 361/35 |
| 5,801,610 A | * | 9/1998 | Levin | 336/12 |
| 7,888,818 B2 | * | 2/2011 | Taylor et al. | 307/64 |
| 2003/0197989 A1 | * | 10/2003 | Nojima | 361/47 |
| 2005/0253564 A1 | * | 11/2005 | Choi | 323/207 |
| 2007/0081281 A1 | * | 4/2007 | Hamer | 361/42 |
| 2009/0251932 A1 | * | 10/2009 | Owen | 363/44 |

OTHER PUBLICATIONS

Velpuri, A.N., et al., "AC/DC/AC Converter Modulation Strategy With Natural Zero sequence Rejection Using Only One Six-Switch Inverter Module", Electric Machines and Drives Conference, IEEE International, vol. 2, pp. 1226-1233, May 2007.

* cited by examiner

*Primary Examiner* — Monica Lewis
(74) *Attorney, Agent, or Firm* — Shimokaji & Associates, P.C.

(57) ABSTRACT

A power conversion system eliminates output transformers and replaces them with a zig-zag transformer and a filter that provides a 3-phase 5-wire system with significantly reduced weight and size as compared with conventional systems. The zig-zag transformer may have a low zero sequence impedance. The power conversion system also ensures operational safety by detecting various types of ground faults.

18 Claims, 18 Drawing Sheets

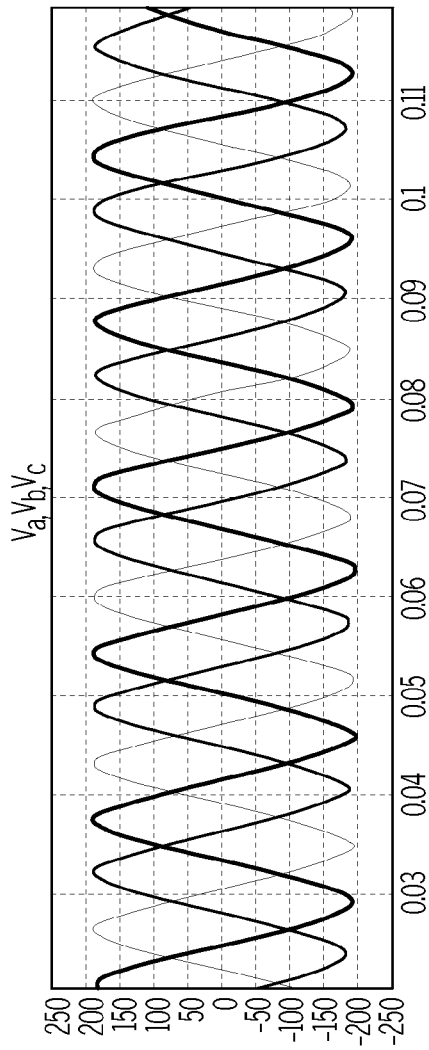
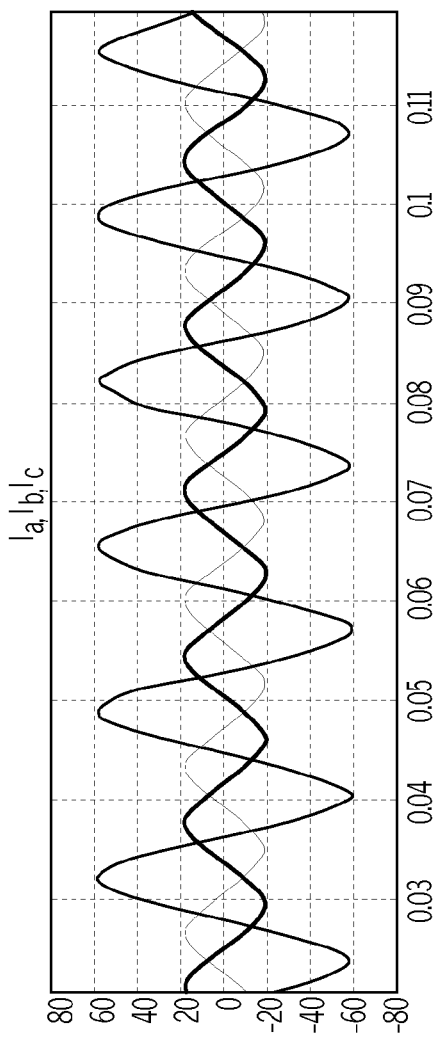

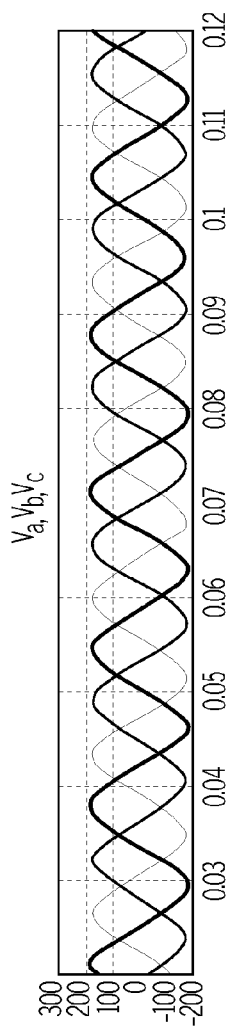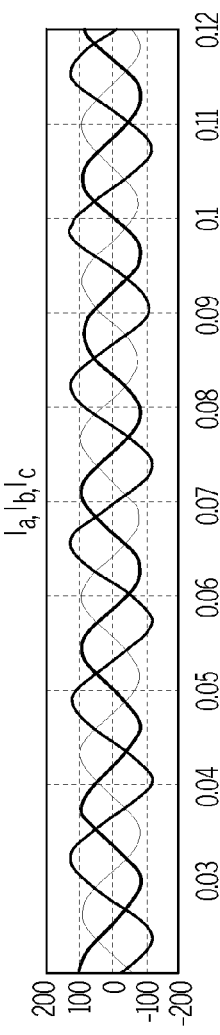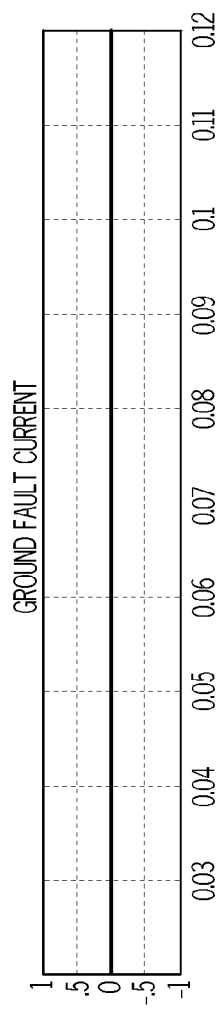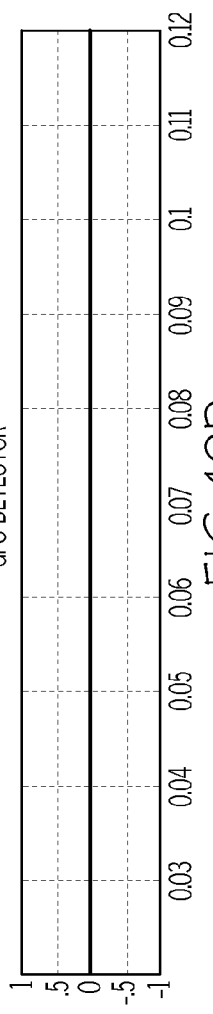

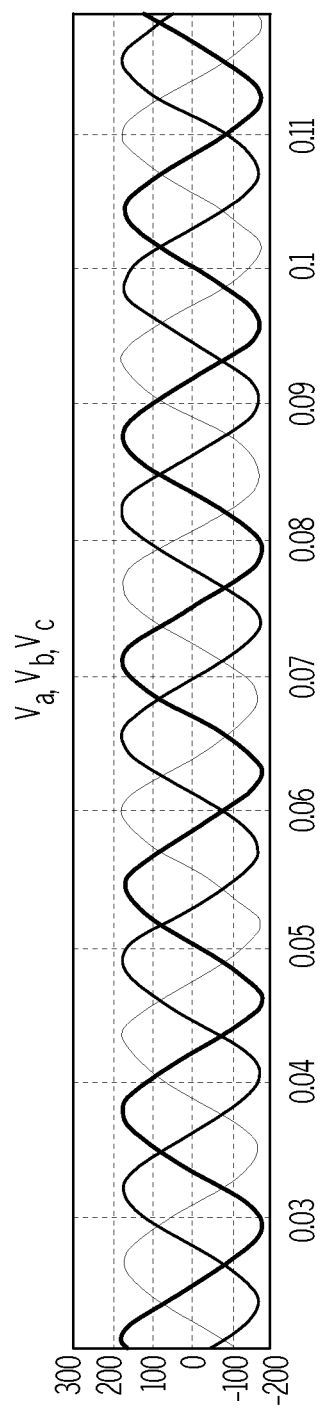
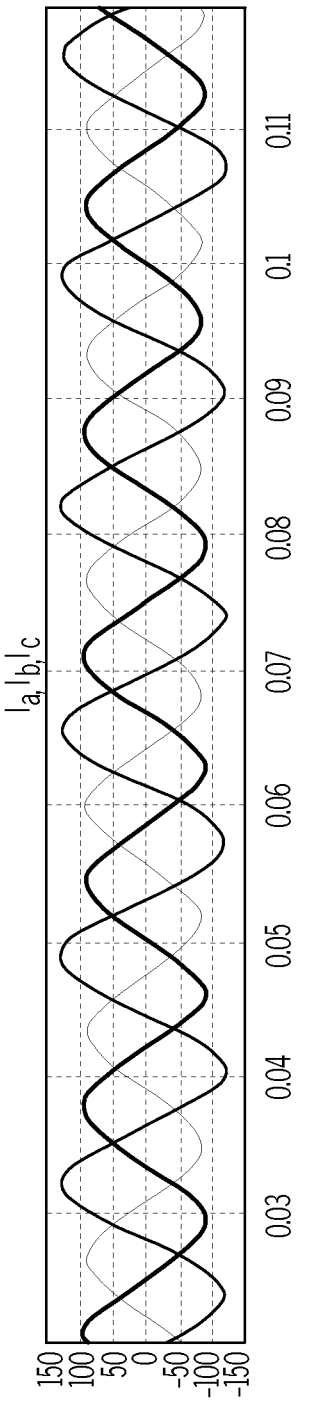
FIG. 11A
FIG. 11B

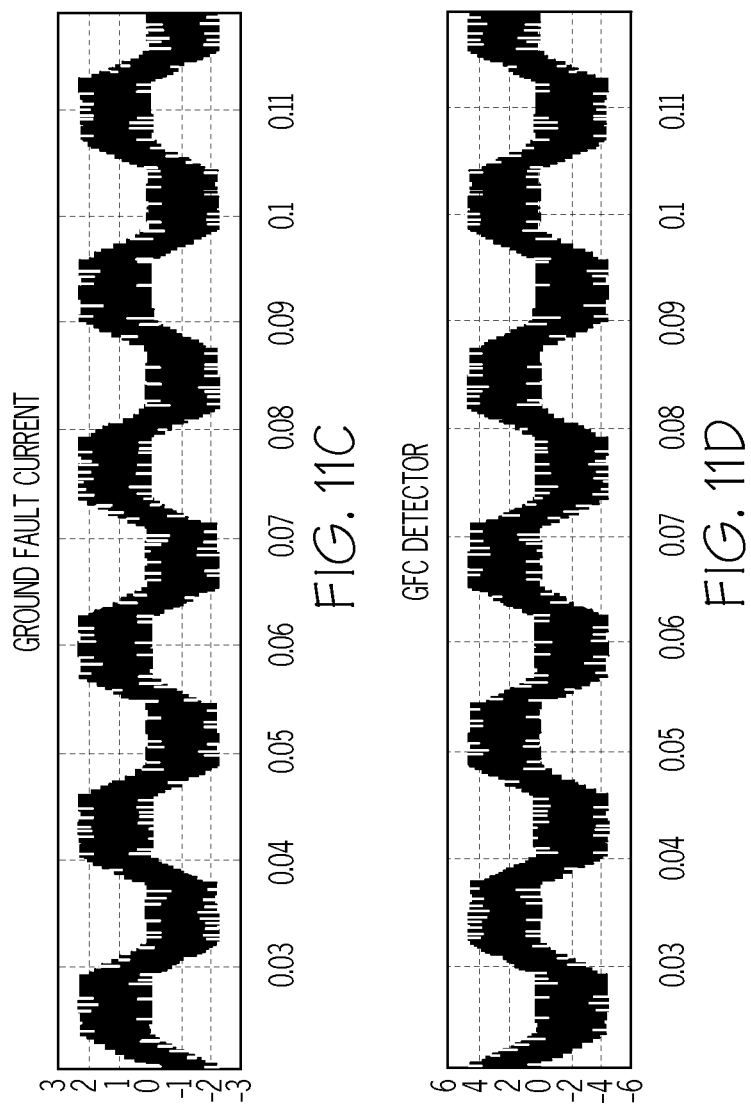

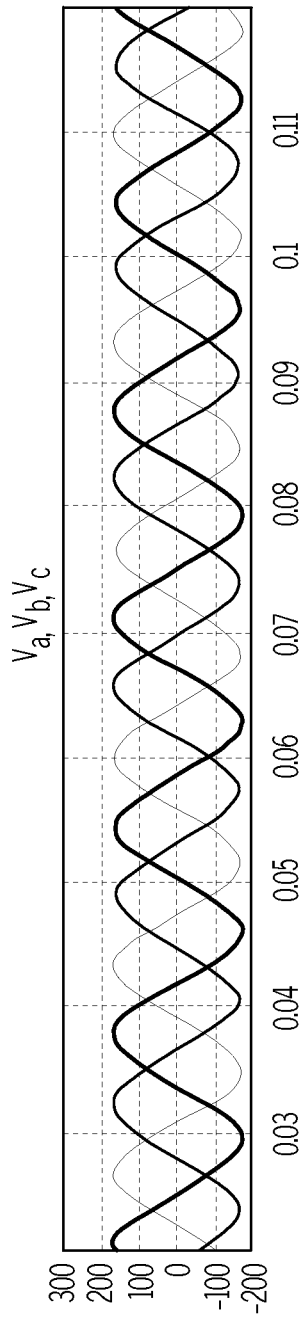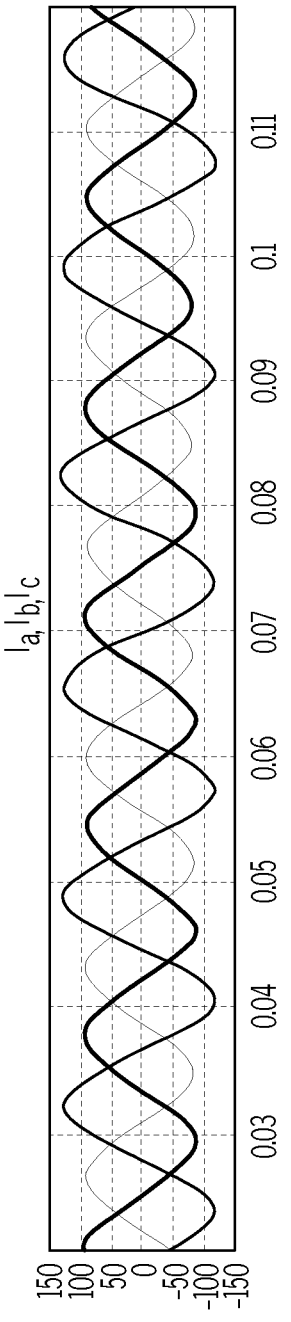

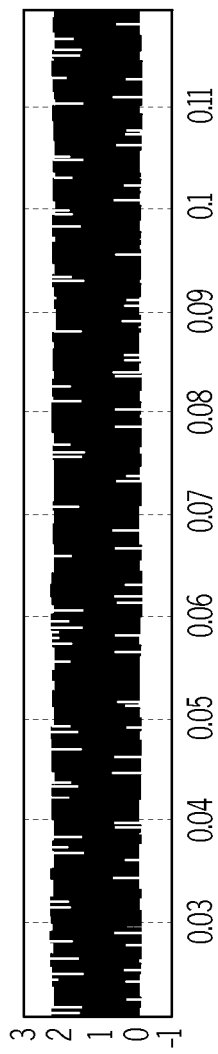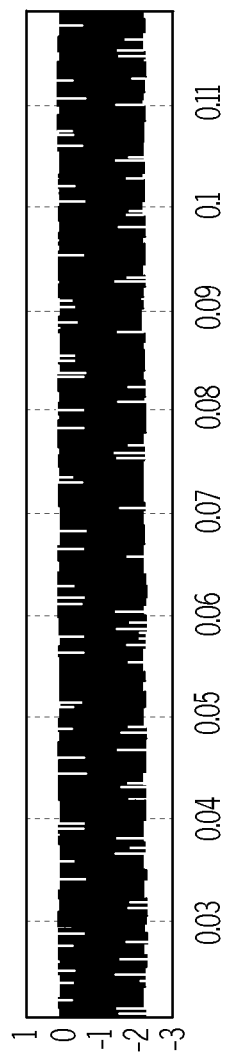

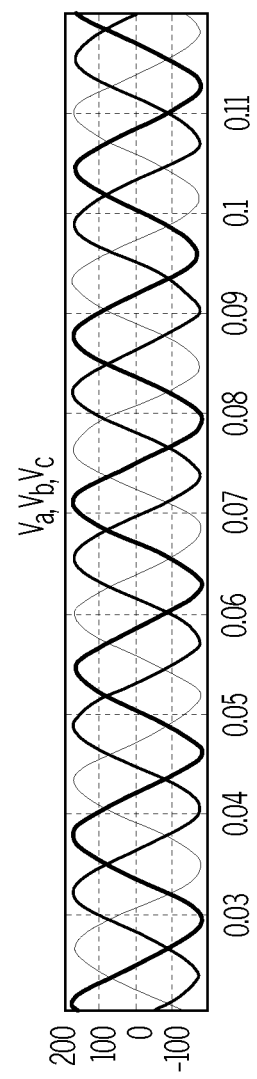
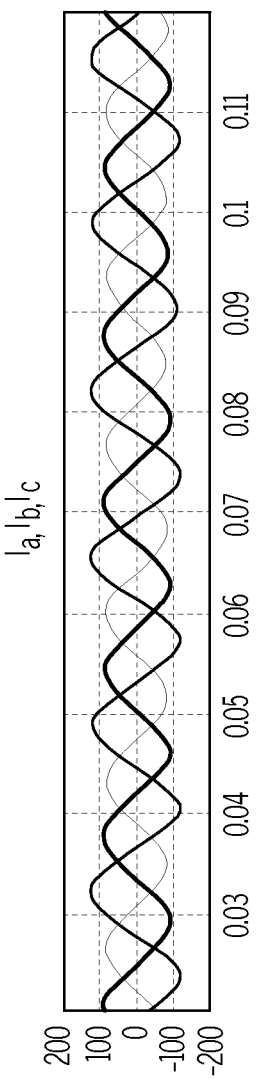
FIG. 13A
FIG. 13B

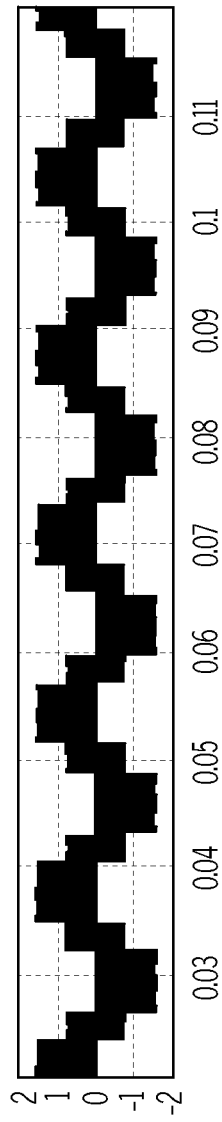
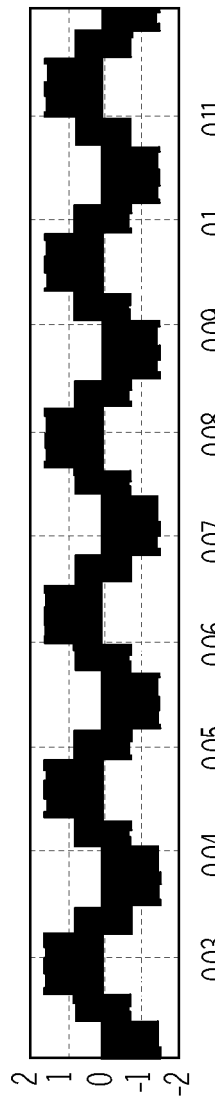
FIG. 13C
FIG. 13D

US 8,964,423 B2

LOW WEIGHT 3-PHASE 5-OUTPUT WIRE POWER CONVERSION SYSTEM FOR MICRO-GRID

BACKGROUND OF THE INVENTION

The present invention relates to apparatus and methods for power conversion systems and, more particularly, a power conversion system providing 3-phase, 5-output wire power.

Micro-grids are rapidly expanding as part of the effort to reduce the dependence on fossil fuels and to increase the efficiency of generating electrical energy. Micro-grids enable a more efficient use of power sources as a function of electrical load and, at the same time, enable the integration of renewable energy sources.

In micro-grids, the two basic approaches to combining power from multiple sources are synchronization—"AC solution" and power combination on a DC bus—"DC link solution", as well as hybrid systems that combine elements of both. The DC and hybrid systems have the advantage of not requiring phase synchronization to combine power from multiple sources.

Referring to FIG. 1, a micro-grid power conversion system 100, following the DC link solution, consists of power sources 102, such as generators, rectifier units 104 to provide AC/DC conversion, inverters 106 to provide DC/AC conversion and output transformers 108. One disadvantage of these conventional systems 100 is that, to achieve a practical 5-wire (three phases, neutral and ground) power conversion system, large and heavy output transformers 108 are required. These transformers 108 are connected at the output of the inverters 106. The inverters 106 have only 3-wires outputs and are incapable to supply single phase loads or unbalanced 3-phase loads. The transformers 108 are typically of a delta-wye configuration, and the center of the wye is used as a return wire (neutral) for the single phase loads. The large size and weight of these transformers 108 is due to the fact that they need to be rated for the full output power and their operation frequency is 60 hertz (Hz) or 50 Hz.

System safety and protection against electrocution is another critical area that needs to be solved for micro-grid systems. The ability to detect ground faults and to shut down the system is required.

Referring to FIG. 2, a mobile micro-grid architecture 200 is shown where three power conversion systems 202, 204, 206 are daisy-chained. The three output transformers 208, 210, 212 weigh approximately 2700 pounds and each one is rated for 75 kilowatt (kW). This is more than 70% of the total micro-grid weight. The large weight and size of the micro-grid is a major drawback, especially for mobile micro-grid applications, such as mobile micro-grids for a forward operating base (FOB).

A conventional substation based high voltage uninterruptible power supply is described in U.S. Pat. No. 7,888,818. This patent describes the use of a reference transformer electrically coupled between a plurality of inverters and the output terminals of the power supply. The '818 patent uses a zig-zag transformer as a reference transformer and is configured to provide at least one of a neutral reference and a ground reference. Providing a reference, however, is different from providing a neutral return for single phase loads, which is not described by the '818 patent.

As can be seen, there is a need for the elimination of the output transformers and the replacement of them with a component with reduced weight and size.

SUMMARY OF THE INVENTION

In one aspect of the present invention, a power conversion system comprises a zig-zag transformer connected in parallel with a load at an output of an inverter, wherein the zig-zag transformer has a low zero sequence impedance.

In another aspect of the present invention, a power conversion system comprises a generator; a rectifier adapted to receive power from the generator and output DC power; an inverter receiving DC power from the rectifier; and a zig-zag transformer connected in parallel with a load at an output of the inverter, wherein the zig-zag transformer has a low zero sequence impedance; and the system provides a phase A wire, a phase B wire, a phase C wire, a neutral wire and a ground wire.

In a further aspect of the present invention, a method for providing balanced output from a power conversion system comprises connecting a zig-zag transformer in parallel with a load at an output of an inverter, wherein the zig-zag transformer has a low zero sequence impedance, wherein a voltage output is balanced, even if the load is a three phase unbalanced load or a single phase load.

These and other features, aspects and advantages of the present invention will become better understood with reference to the following drawings, description and claims.

BRIEF DESCRIPTION OF THE DRAWINGS

FIGS. 9A and 9B are screen displays of simulation results showing voltage regulation with a zig-zag transformer, with reduced zero sequence impedance, showing a single phase load;

FIGS. 10A-10D are screen displays of simulation results showing an unbalanced load, with no fault;

FIGS. 11A-11D are screen displays of simulation results showing a generator phase to ground fault;

FIGS. 12A-12D are screen displays of simulation results showing a rectifier output to ground fault;

FIGS. 13A-13D are screen displays of simulation results showing an inverter phase to ground fault.

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features.

Broadly, embodiments of the present invention provide a power conversion system that eliminates output transformers and replaces them with a zig-zag transformer and a filter that provides a 3-phase 5-wire system with significantly reduced weight and size as compared with conventional systems. The zig-zag transformer may have a low zero sequence impedance. The power conversion system of the present invention also ensures operational safety by detecting various types of ground faults.

Figure 1:
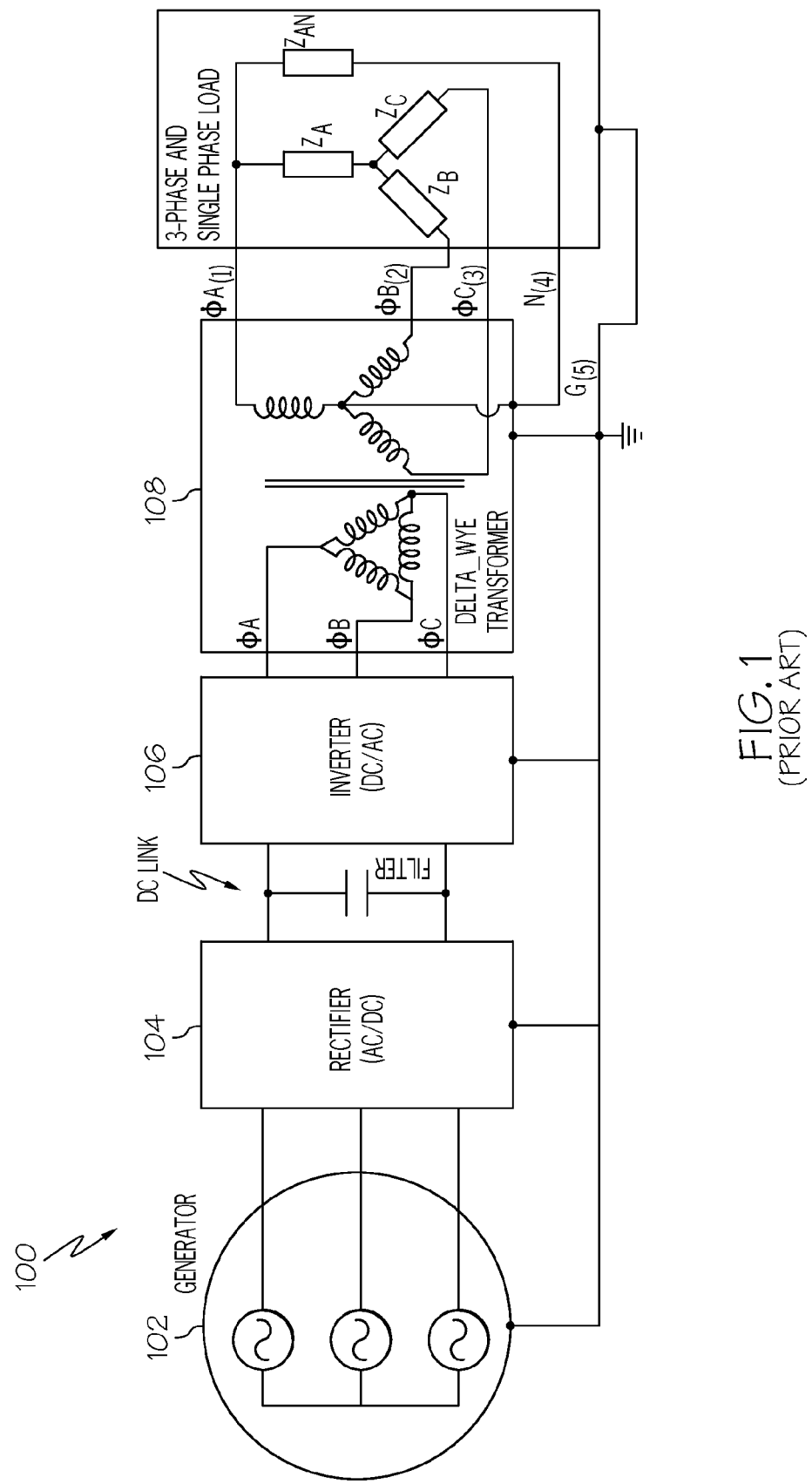
FIG. 1 is a schematic diagram of a single channel power conversion system of the prior art.
Figure 2:
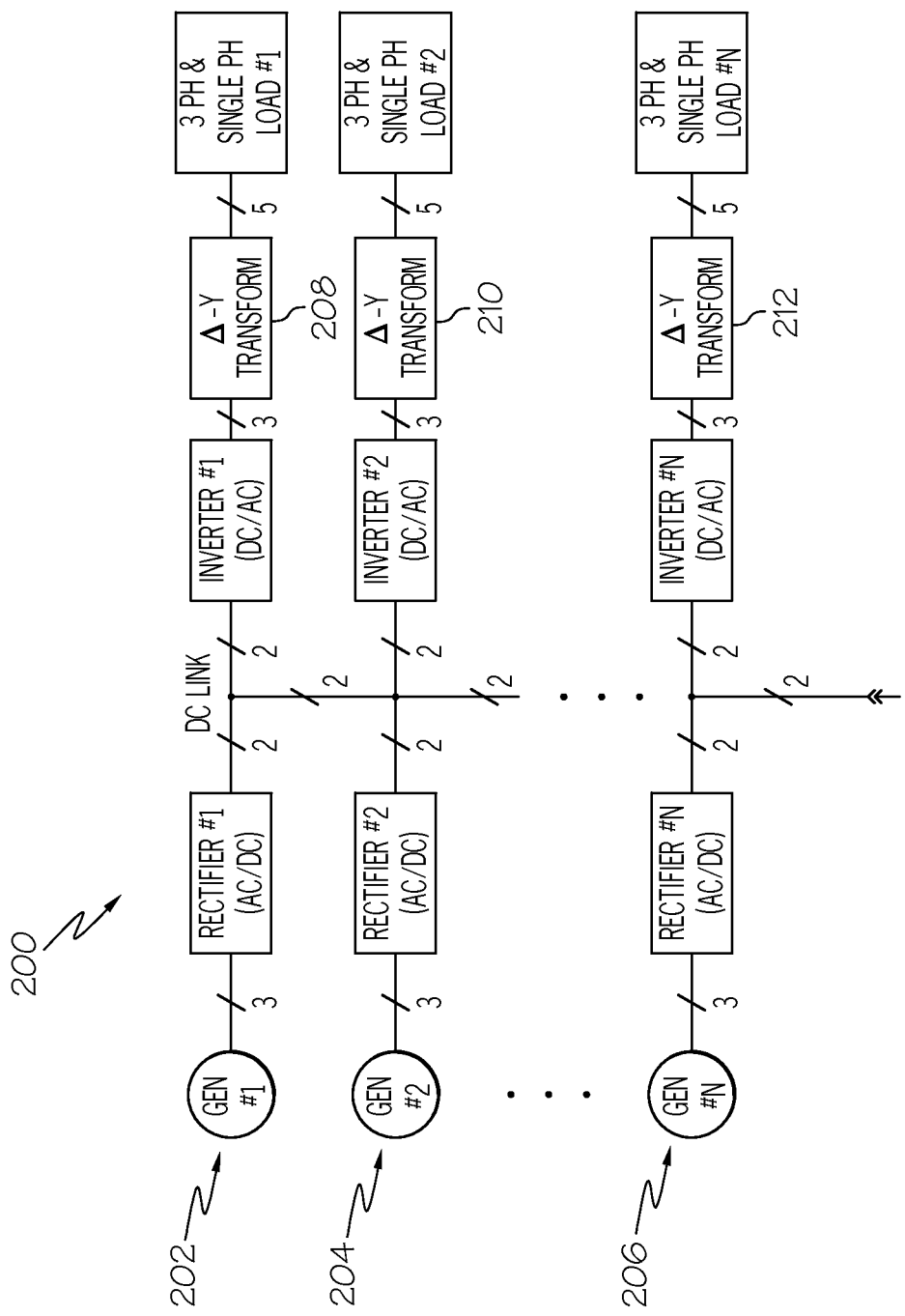
FIG. 2 is a schematic diagram of a micro-grid system of the prior art.
Figure 3:
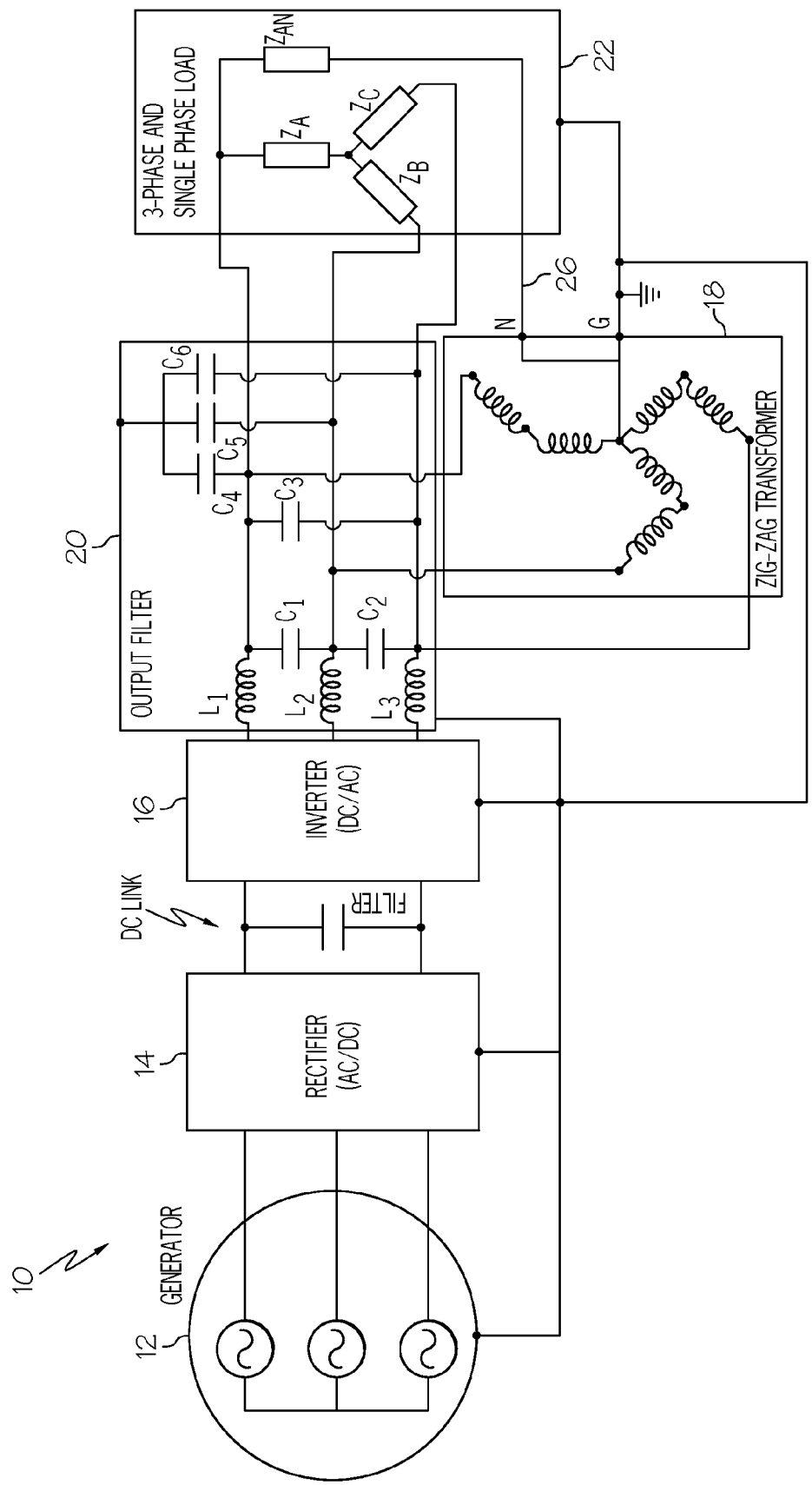
FIG. 3 is a schematic diagram of a single channel low weight power conversion system according to an exemplary embodiment of the present invention.

Referring to FIG. 3, a mobile micro-grid 10 may include generators 12 for generating power, a rectifier 14 for converting the generator AC output to DC, a DC link connecting the rectifier 14 with an inverter 16 adapted to convert its DC input to AC. A zig-zag transformer 18 may be connected in parallel with the load at the AC output of the inverter 16. The zig-zag transformer 18 may reduce the weight of the micro-grid 10 to about one-half that of conventional systems.

The zig-zag transformer 18 may be used for creating a 3-phase 5-wire system together with a three leg inverter. The zig-zag transformer 18 may have three output wires (and phases). The zig-zag transformer 18 may be used to provide not only a system ground, but also a system neutral. During single phase or unbalanced load operation, the zig-zag transformer's coils' magnetic flux are no longer equal in the loaded (or faulted) line. This allows zero sequence current to now flow from the point of the fault to ground and return to the zig-zag transformer's neutral.

A filter 20 may be provided at the output of the inverter 16. The filter 20 may ensure that the inverter's output waveforms are compatible with the power grid.

As shown in FIG. 3, the zig-zag transformer 18 may be connected in parallel with a load 22 at the output of the inverter 16. This type of connection permits the zig-zag transformer 18 to be rated at only a fraction of the rating of a delta-wye transformer used in conventional systems. Rather than being rated for the entire system output power, the zig-zag transformer 18 may need to be rated only for the power required by the single phase loads or the amount of unbalance of the 3 phase loads. As an example, assume that the single phase loads of the system shown in FIG. 3 are 30% of the overall load of 75 kW, the zig-zag transformer 18 may be rated for only 25 kW. This will result in significant weight and volume savings. A 75 kW delta wye transformer can weight about 900 pounds, while a 25 kW zig-zag transformer may weight about 165 pounds.

A neutral wire 26 produced with the zig-zag transformer 18 can be used as a return for the single phase electrical loads.

Figure 4:
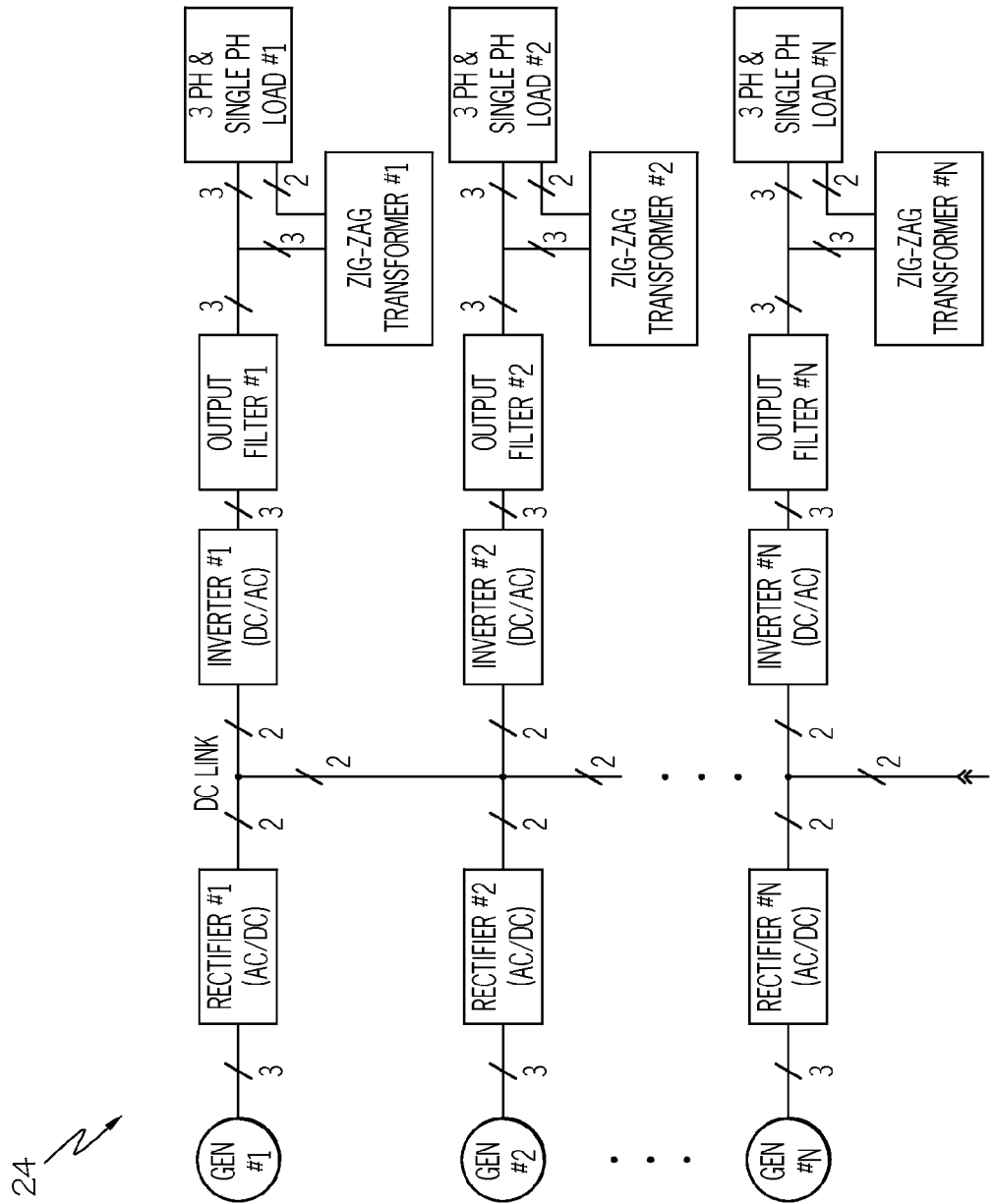
FIG. 4 is a schematic diagram of a micro-grid system using the low weight power conversion system of FIG. 3.

Referring to FIG. 4, a power conversion system 24 may use the zig-zag transformer 18. To achieve the 3-phase 5-wire system, the inverter voltage and frequency may be controlled. The frequency may be controlled to 60 Hz or 50 Hz and the voltage to 208 VAC line to line. Different voltage levels, such as 480 VAC, can be controlled. The output filter 20 may smooth the inverter voltage and eliminate switching ripple. The filter 20 may include differential inductors and capacitors. The number next to each line refers to the number of wires designated by a single line. For example, the number three between the generator 12 and the rectifier 14 refers to three wires being present.

Voltage regulation may be achieved by regulating the three inverter output voltages to a preset value, such as 120 VAC line to neutral. The zig-zag transformer 18 may be designed to have low zero sequence impedance in order to maintain good voltage regulation during operation with an unbalanced load or a single phase load. Due to its connection in parallel with the load, only the zero sequence impedance may cause a voltage drop during an unbalanced load or a single phase load. In some embodiments, a low zero sequence impedance may be no more than about 30 percent of the total system impedance. In some embodiments, a low zero sequence impedance may be no more than about 10 percent of the total system impedance, often not more than about 5 percent of the total system impedance.

Figure 5A:
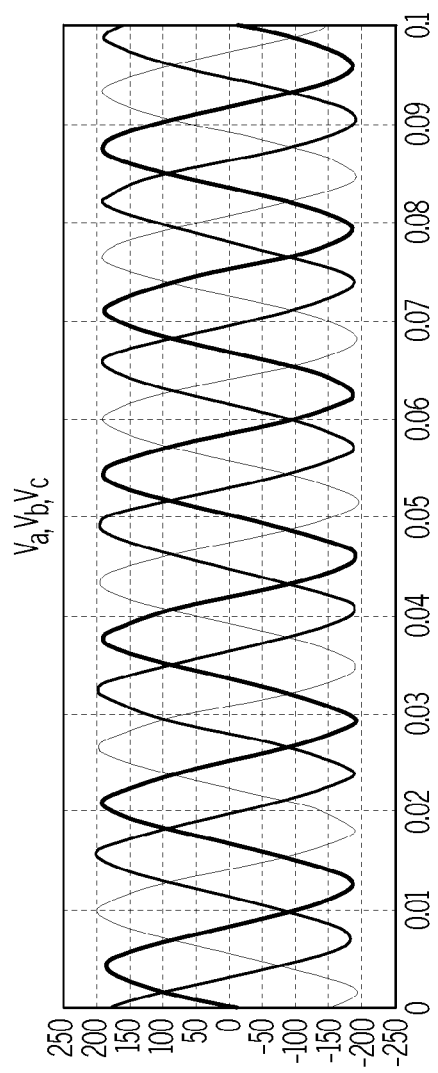
FIGS. 5A and 5B are screen displays of simulation results showing voltage regulation with a zig-zag transformer, without reduced zero sequence impedance, showing a balanced load.
Figure 5B:
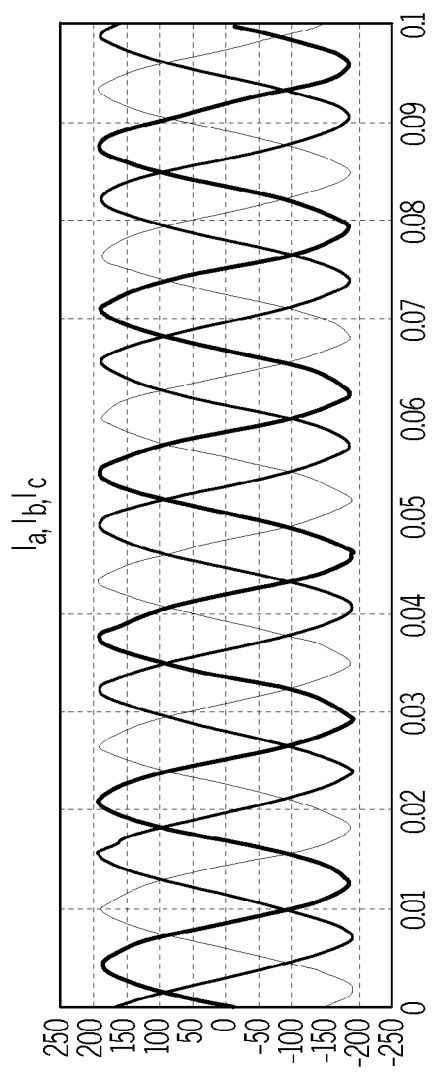
Figure 6A:
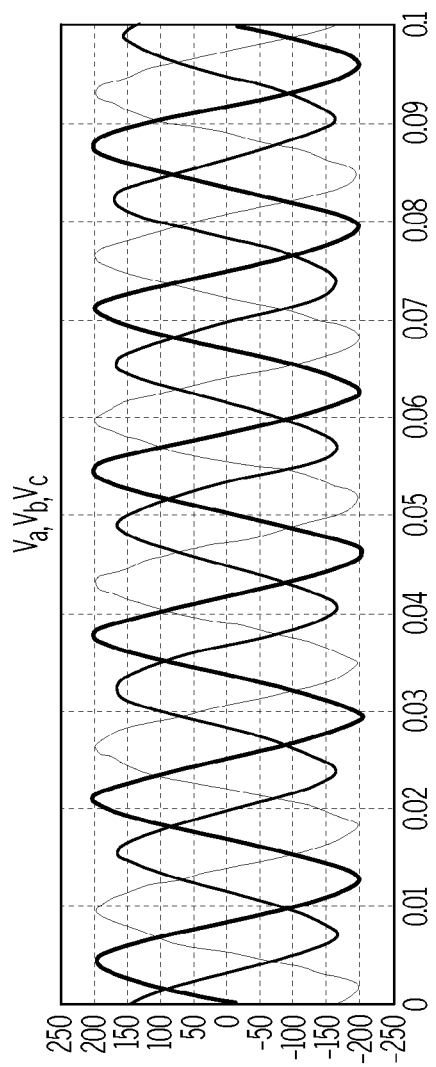
FIGS. 6A and 6B are screen displays of simulation results showing voltage regulation with a zig-zag transformer, without reduced zero sequence impedance, showing an unbalanced, single phase load.
Figure 6B:
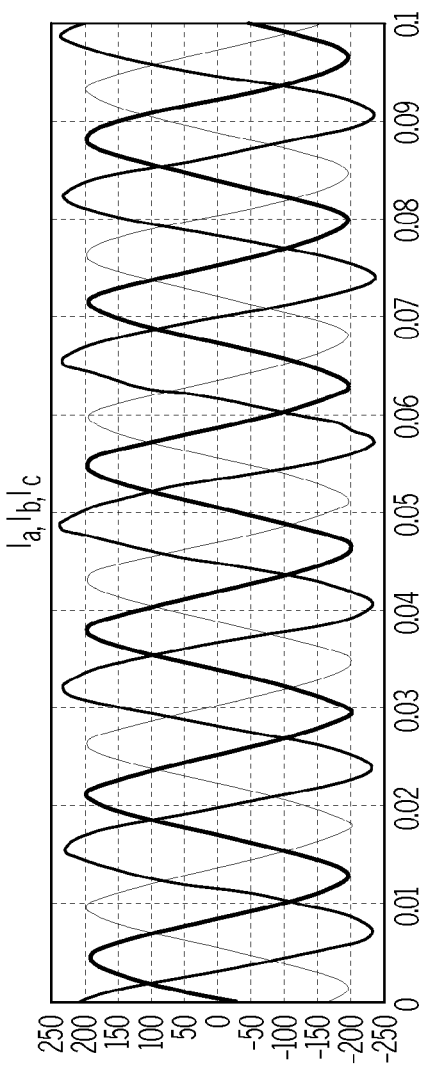

Referring to FIGS. 5A and 5B, simulation results of a zig-zag transformer with high zero sequence impedance when the system supplies balanced loads are shown. As used herein, high zero sequence impedance may be impedance greater than the low zero sequence impedance, defined above. FIGS. 6A and 6B show simulation results of the same zig-zag transformer of FIGS. 5A and 5B (with high zero sequence impedance) when unbalanced loads are supplied. In FIGS. 6A and 6B, an output voltage of the system supplied to the load is unbalanced.

Figure 7A:
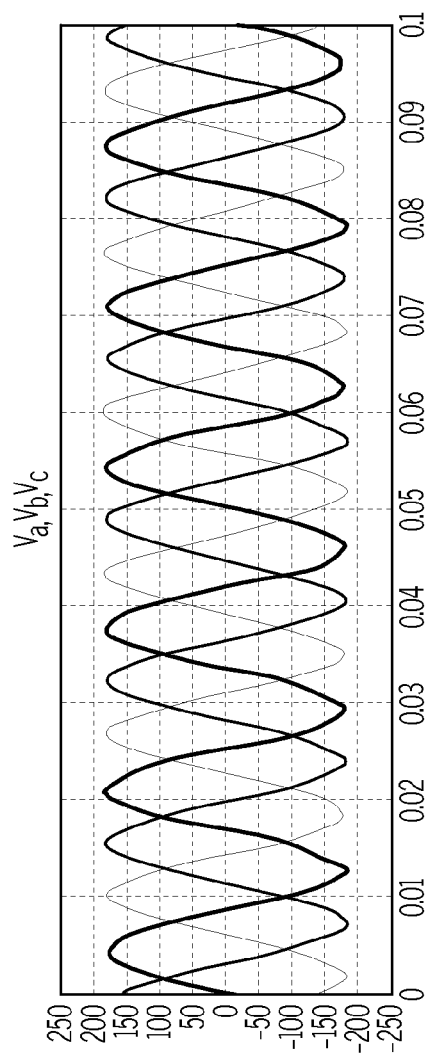
FIGS. 7A and 7B are screen displays of simulation results showing voltage regulation with a zig-zag transformer, with reduced zero sequence impedance, showing a balanced load.
Figure 7B:
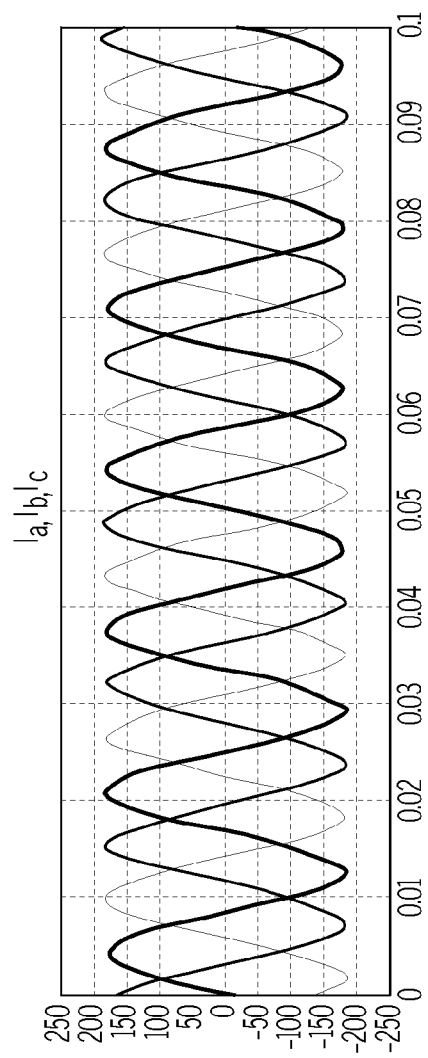
Figure 8A:
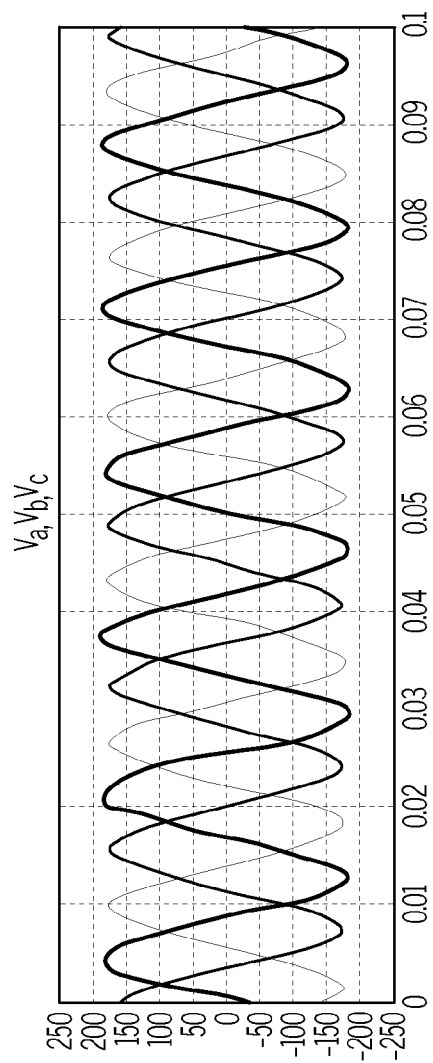
FIGS. 8A and 8B are screen displays of simulation results showing voltage regulation with a zig-zag transformer, with reduced zero sequence impedance, showing an unbalanced load.
Figure 8B:
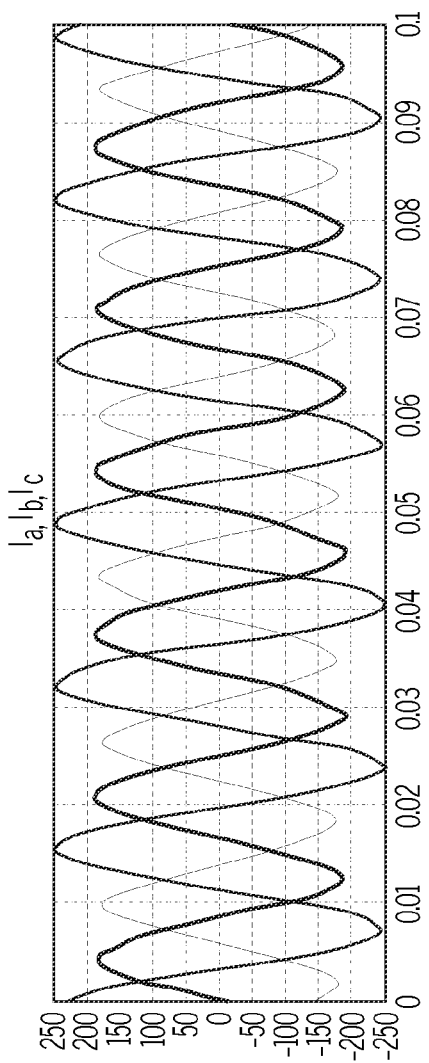
Figure 14A:
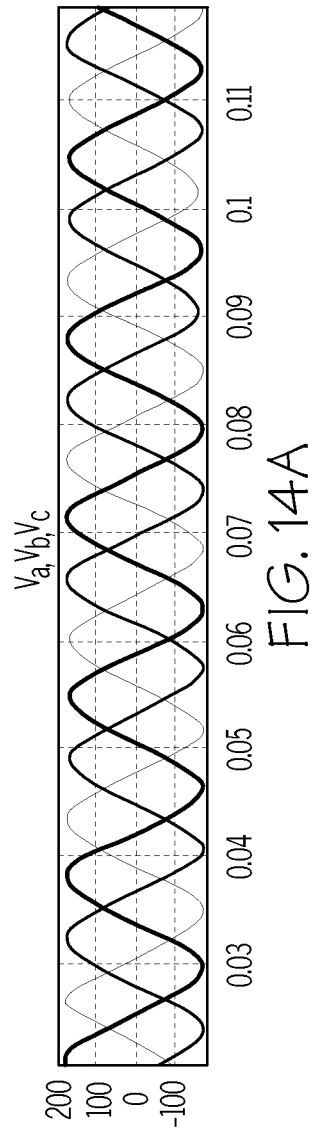
FIGS. 14A-14D are screen displays of simulation results showing a fault to ground on the load side.
Figure 14B:
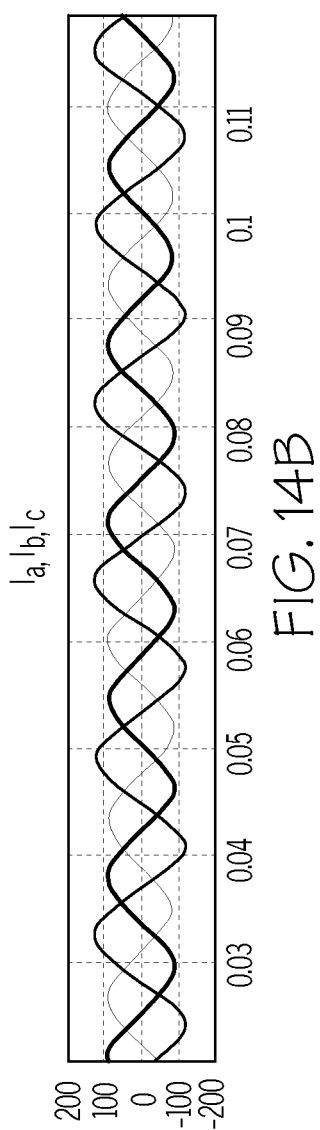
Figure 14C:
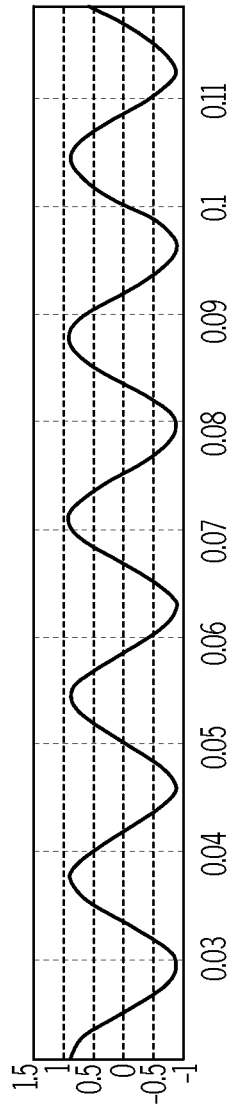
Figure 14D:
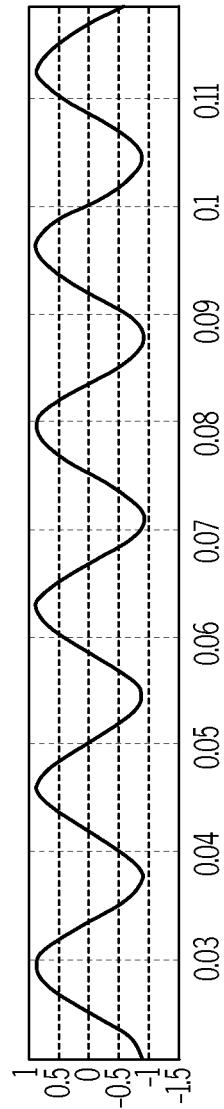

FIGS. 7A and 7B show a zig-zag transformer with low zero sequence impedance when the system supplies balanced loads. As expected, these results are similar to those of FIGS. 5A and 5B. The improvement of the low zero sequence impedance zig-zag transformer when unbalanced electrical loads are drawn is shown in FIGS. 8A and 8B. In this case, the output voltages of the system supplied to the loads are balanced.

FIGS. 9A and 9B show the operation of the zig-zag transformer with low zero-sequence impedance when one phase carries most of the electrical load and the other two phases are lightly loaded. With the present invention, the output voltages of the system across the phases are balanced.

A ground fault detection scheme may be implemented by monitoring the currents in the phase A wire, the phase B wire, the phase C wire, the neutral wire and capacitors to ground. The sum of these currents will be zero during three phase, single phase currents or unbalanced load operation. A device, such as RCMA420, manufactured by Bender Inc. can be used for monitoring these currents. Three phases unbalanced load operation in FIGS. 10A-10D, when no ground fault is present. It is noted that the plots showing ground fault current (GFC) and the GFC detector are zero, as expected.

FIGS. 11A-11D show a generator phase to ground fault. FIGS. 12A-12D show a rectifier output to ground fault. FIGS. 13A-13D show an inverter phase to ground fault. A fault to ground on the load side is shown in FIGS. 14A-14D. To validate the sensitivity and effective operation of the GFC detector, the ground shout-circuit current is only a few amperes, which is a condition difficult to detect, but potentially harmful for personnel. In all the cases simulated (FIGS. 11A through 14D), the fault was detected and the output of the GFC detector is active, as shown in each of FIGS. 11C, 11D, 12C, 12D, 13C, 13D, 14C and 14D.

It should be understood, of course, that the foregoing relates to exemplary embodiments of the invention and that modifications may be made without departing from the spirit and scope of the invention as set forth in the following claims.

I claim:

1. A power conversion system comprising:
an inverter including an inverter A phase output, an inverter B phase output, and an inverter C phase output, and wherein the inverter A, B, and C phase outputs are AC power output connections, and wherein the inverter does not provide a neutral connection;
a zig-zag transformer including a transformer A phase connected to the inverter A phase output, a transformer B phase connected to the inverter B phase output, a transformer C phase connected to the inverter C phase output, and a transformer neutral connected to a system ground; and
wherein the zig-zag transformer has a low zero sequence impedance; and
wherein the power conversion system includes load connections, the load connections including;
a phase A wire connected to the inverter A phase output and the transformer A phase,
a phase B wire connected to the inverter B phase output and the transformer B phase,
a phase C wire connected to the inverter C phase output and the transformer C phase,
a neutral wire connected to the transformer neutral, and
a ground wire connected to the system ground.

2. The power conversion system of claim 1, further comprising:
a generator; and
a rectifier receiving power from the generator to output DC power; and
wherein the inverter receives DC power from the rectifier.

3. The power conversion system of claim 2, further comprising an output filter disposed between the outputs of the inverter and the load connections.

4. The power conversion system of claim 1, wherein the low zero sequence impedance is no more than about 30 percent of a total system impedance.

5. The power conversion system of claim 1, wherein the low zero sequence impedance is no more than about 10 percent of a total system impedance.

6. The power conversion system of claim 1, wherein the low zero sequence impedance is no more than about 5 percent of a total system impedance.

7. The power conversion system of claim 1, wherein the zig-zag transformer is rated for either single phase loads or for an amount of unbalance of three phase loads.

8. The power conversion system of claim 2, further comprising a DC link formed between the rectifier and the inverter.

9. A power conversion system comprising:
a generator;
a rectifier adapted to receive power from the generator and output DC power;
an inverter receiving DC power from the rectifier, the inverter including an inverter A phase output, an inverter B phase output, and an inverter C phase output, and wherein the inverter A, B, and C phase outputs are AC power output connections, and wherein the inverter does not provide a neutral connection; and
a zig-zag transformer including a transformer A phase connected to the inverter A phase output, a transformer B phase connected to the inverter B phase output, a transformer C phase connected to the inverter C phase output, and a transformer neutral connected to a system ground; and
wherein:
the zig-zag transformer has a low zero sequence impedance; and
the power conversion system includes load connections, the load connections including; a phase A wire connected to the inverter A phase output and the transformer A phase, a phase B wire connected to the inverter B phase output and the transformer B phase, a phase C wire connected to the inverter C phase output and the transformer C phase, a neutral wire connected to the transformer neutral, and a ground wire connected to the system ground.

10. The power conversion system of claim 9, further comprising an output filter disposed between the outputs of the inverter and the load connections.

11. The power conversion system of claim 9, wherein the low zero sequence impedance is no more than about 30 percent of a total system impedance.

12. The power conversion system of claim 9, wherein the low zero sequence impedance is no more than about 10 percent of a total system impedance.

13. The power conversion system of claim 9, wherein the low zero sequence impedance is no more than about 5 percent of a total system impedance.

14. The power conversion system of claim 9, wherein the zig-zag transformer is rated for either single phase loads or for an amount of unbalance of three phase loads.

15. The power conversion system of claim 9, further comprising a DC link formed between the rectifier and the inverter.

16. A method for providing balanced output from a power conversion system, comprising:
connecting an A phase of a three phase load to an A phase AC power output of an inverter, and an A phase of a low zero sequence impedance zig-zag transformer;
connecting a B phase of the three phase load to a B phase AC power output of the inverter, and a B phase of the zig-zag transformer;
connecting a C phase of the three phase load to a C phase AC power output of an inverter, and a C phase of the zig-zag transformer; and
connecting a single phase load between one of A phase AC power output of an inverter, the B phase AC power output of the inverter, or the C phase AC power output of an inverter; and the neutral of the zig-zag transformer; and
wherein a load voltage output is balanced.

17. The method of claim 16, further comprising detecting a ground fault in the power conversion system by monitoring the currents in each phase of the three phase load, in the neutral of the phases and the transformer wire, and in power conversion system capacitors to a power conversion system ground.

18. The method of claim 16, wherein the three phase load includes an unbalanced three phase load.

* * * * *